July 25, 1961 V. F. DAHLGREN 2,994,058

PRINTED CIRCUIT ARTICLE

Filed May 29, 1958 2 Sheets-Sheet 1

Victor F. Dahlgren
*INVENTOR*

July 25, 1961 V. F. DAHLGREN 2,994,058

PRINTED CIRCUIT ARTICLE

Filed May 29, 1958 2 Sheets-Sheet 2

Victor F. Dahlgren
*INVENTOR*

United States Patent Office 2,994,058

Patented July 25, 1961

2,994,058

PRINTED CIRCUIT ARTICLE

Victor F. Dahlgren, West Windham, N.H., assignor to Sanders Associates, Inc., Nashua, N.H., a corporation of Delaware Filed May 29, 1958, Ser. No. 738,898
2 Claims. (Cl. 339—100)

The present invention relates to flexible cabling utilizing copper conductors bonded to a wide range of plastic materials.

More particularly, this invention relates to flexible, preformed cable conductors.

In the prior art, flexible cables are formed from flat, relatively thin sheets of plastic material having imbedded therein thin conductors all in the same plane or, at most, in a few superimposed planes. In one form of such a cable, the conductors are of uniform width and are separated uniformly. The present invention is directed to an improvement over such circuits and cables by providing a solution for the problems arising from wiring and soldering connections to a wide range of electrical apparatus. In the past, the wiring of electrical systems having a number of connections, such as for example terminal pins, plugs, or jacks, required the wire to be stripped and soldered or clamped to the conductor or terminal. Then too, in complicated systems it is difficult to avoid wiring errors. Many of these problems have been simplified to some extent by the use of printed circuit techniques which provide pre-connected assemblies. Such printed circuits generally take the form of relatively rigid dielectric boards having conductors bonded to one or more surfaces thereof. While such an arrangement is suitable for certain electrical and electronic applications it cannot be used to replace conventional wiring where length and flexibility are essential. The improvement here, however, is over printed circuits by using preformed conductors in the same form factor as printed circuits. The disadvantages of printed or etched conductors are overcome by providing a more rugged, preformed conductor of greater current-carrying capacity which is uniquely capable of engaging the terminals of an electrical apparatus.

It is, therefore, an object of the present invention to provide an improved flexible, circuit article having preformed conductors.

It is a further object of this invention to provide an improved, flexible circuit article having reformed conductors adapted for simplified engagement with the terminals of an electrical component.

Yet another object of the present invention is to provide an improved flexible circuit cable having preformed conductors that may be deformed into any given shape and will maintain that shape.

In accordance with the present invention, there is provided a flexible circuit article, comprising a flat flexible sheet of plastic insulated material. Laminated to this sheet of plastic insulating material are a plurality of hollow flexible, elongated conductors to provide a flexible circuit having apertured conductor ends, thus facilitating coupling of the conductors to electrical apparatus with jack-type terminals.

The term "plastic" as used herein includes a synthetic, organic material of high molecular weight and which, while solid in the finished state, at some stage in its manufacture is soft enough to be formed into shape by some degree of flow.

The well-known term "Kel-F" as used herein is the trademark of The M. W. Kellogg Company and refers to the plastic polymonochlorotrifluoromethylene as manufactured by them.

The well-known term "Teflon" as used herein is the trademark of the E. I du Pont de Nemours & Company, Inc. and refers to the plastic polytetrafluoroethylene as manufactured by them.

The term "ethylene" includes all those plastic materials containing an ethylene radical and the term "vinyl" includes all those plastic materials containing a vinyl radical.

The term "Saran," trademark of the Dow Chemical Company, is used herein to denote those plastic materials containing a vinylidene radical.

The term "nylon" as used herein refers generically to the group of plastic materials known as polyamides.

For a better understanding of the present invention together with other and further objects thereof, reference is made to the following description taken in connection with the accompanying drawings and its scope will be pointed out in the appended claims.

Figures 1, 2, 3, 4, 5:
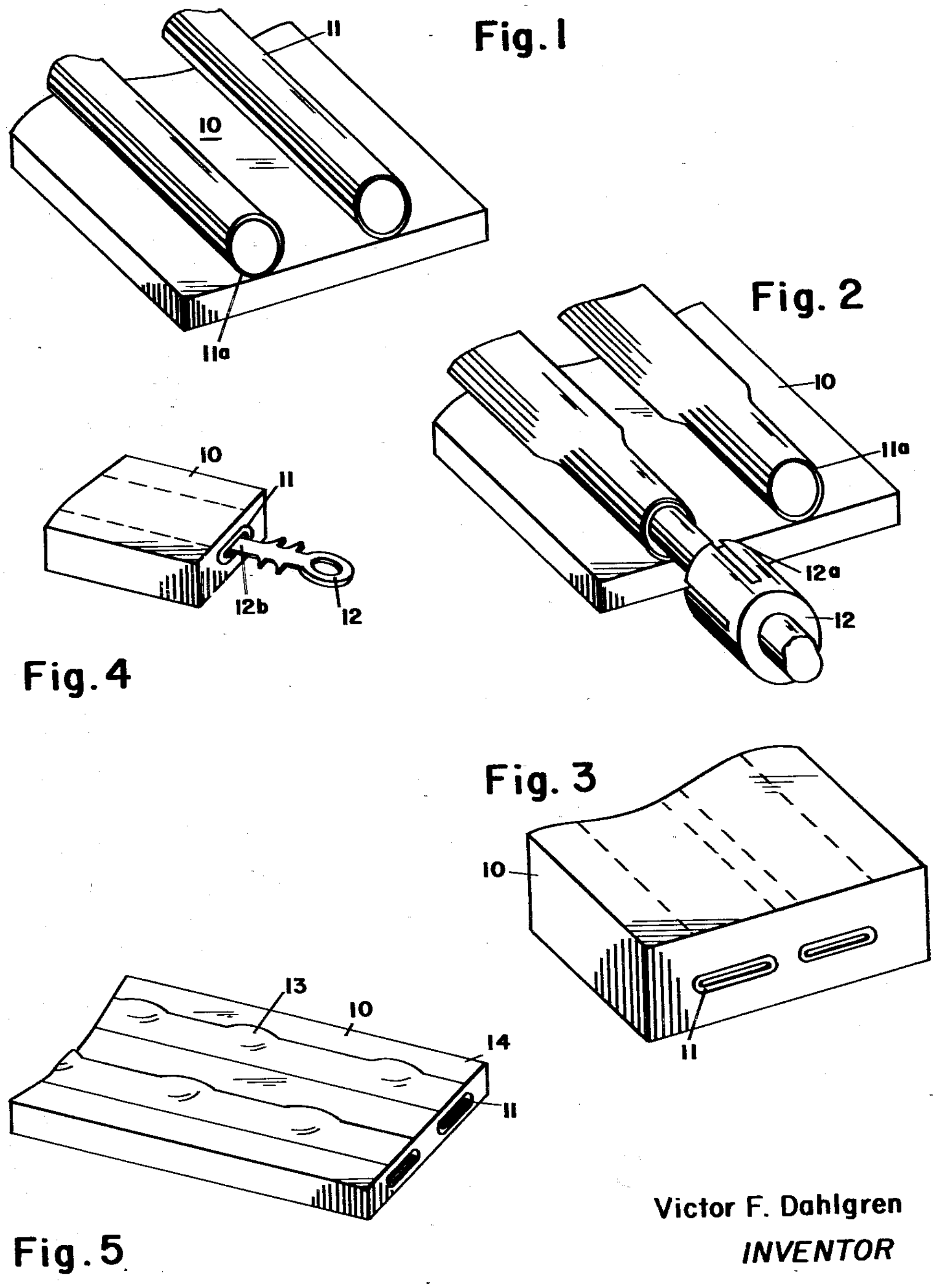
FIG. 1 is a perspective view of a flexible circuit cable embodying a conductor structure of the present invention.
FIG. 2 is a perspective view of another flexible circuit cable embodiment illustrating its engagement with a jack.
FIG. 3 is a perspective view of a flexible circuit cable embodying yet another conductor structure of the present invention.
FIG. 4 is a perspective view of the flexible circuit cable of FIG. 3 illustrating its engagement with an electrical terminal.
FIG. 5 is a perspective view of a further embodiment of the conductor structure of the present invention.

Referring now to the drawings and with particular reference to FIG. 1, there is here shown a flat, flexible circuit 10 in cable form having preformed conductors 11. An important feature of the present invention lies in the tubular structure of the conductors 11. The apertured ends 11*a* of the conductor 11 make them readily adaptable for receiving a connector or terminal 12 such as those illustrated in FIGS. 2 and 4. The connector or terminal 12 may be made with external gripping elements 12*a* as in FIG. 2 or with a burred shank 12*b* as illustrated in the embodiment of FIG. 4. Either of these arrangements facilitates a permanent, solderless, simultaneous mechanical and electrical connection of the terminal 12 with the conductor 11 when inserted therein. The retaining elements on the shank 12*b* are inclined at an angle which affords minimum resistance to insertion and maximum resistance to withdrawal. For convenience, the terminals 12 are illustrated as a jack and a ring-type connector; however, the structures illustrated could be incorporated in a spade connector, a butt connector, a probe, or any other terminal or connector of this type.

Referring now to FIG. 2, there is here illustrated a preformed circuit 10 in cable form having a plurality of flattened, tubular, flexible, elongated conductors 11 with unflattened ends 11*a*. An important feature of this flattened, tubular conductor is that it has an apertured end adapted for receiving a terminal or connector 12, such as illustrated, and has a substantially flat form factor enabling its use in a preformed circuit cable of lesser thickness for a given amount of insulation, than would be possible using an entirely unflattened tubular conductor.

Illustrated in FIG. 3 is a modification of the embodiment of FIG. 2 in which the tubular conductors 11 are entirely flattened and fully encapsulated in insulating material. Such a structure has substantially the same merits as that of FIG. 2. FIG. 4 is a perspective view of the embodiment of FIG. 3 showing insertion of a terminal therein, as more fully described above.

Illustrated in FIG. 5 is a further embodiment of the present invention. Here there are a plurality of flattened tubular conductors 11 having prepositioned slugs of solder 13 disposed therein. This feature facilitates attachment of an external conductor by, for example, piercing the insulation 14 and conductor 11 and securing the external conductor to the cable conductor 11 by means of the solder slug 13 exposed thereby. A good bond may be secured, for example, by inductively heating the area of attachment to fuse the external conductor into the solder slug 13.

Figure 6:
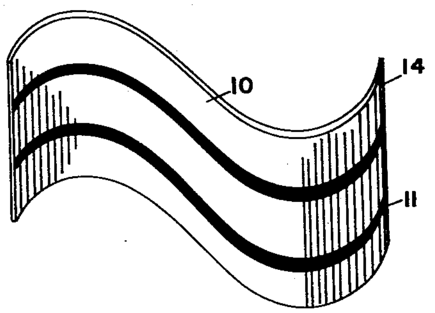
FIG. 6 is a perspective view of the flexible circuit cable of the present invention illustrating its flexibility and capability of retaining a deformation.
Figure 7:
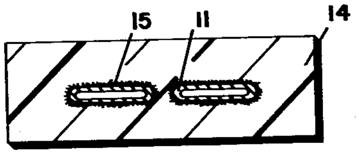
FIG. 7 is an illustrational view, in section, of the flexible circuit cable of FIG. 3.

Referring now to FIG. 6, there is here illustrated a flat, flexible, preformed circuit cable 10 of the present invention in a flexed position. This points up another unique property of the printed circuit cable of the present invention, viz., that it may be manually manipulated into any given shape or contour and will remain in that shape, whereas conventional wire or cables with thin foil-like conductors will have a tendency to spring back into the unflexed position. This is an extremely important feature when adapting a preformed circuit to a system requiring the circuits' enclosure in a small area. The cable of the present invention may be manually formed or shaped to fit a given enclosure and it will remain in that configuration. This facilitates hook-up of the individual conductors.

While applicant does not intend to be limited to any particular materials in the manufacture of the article of this invention, the combination of copper conductors with polymonochlorotrifluoroethylene insulation has been found to be particularly useful. For example, the preformed circuit cable may be formed from 3/16 inch outside diameter copper tubing having an adherent coating of black cupric oxide formed by oxidation in a chemical bath. These conductors are then readily laminated between, for example 10 mil (0.010 inch) sheets of polymonochlorotrifluoroethylene. FIG. 5 particularly illustrates the laminate structure showing in cross section the copper conductor 11, the cupric oxide coating 15 and the polymonochlorotrifluoroethylene insulation 14. Other plastic materials that have been successfully employed to produce the article of this invention include polyethylene, Teflon, polyvinyl acetate, and polyvinyl chloride; however, as stated above, it is believed that this principle applies broadly to all plastics and applicant does not intend to be limited to those cited in the examples.

To illustrate more completely the method and types of material that may be used to manufacture the article of this invention, there follow several examples of bonding copper tubing to plastic materials.

*Polymonochlorotrifluoroethylene-copper article*

Referring now to FIG. 6, a flow chart for a method of manufacturing a preformed circuit in accordance with the present invention is illustrated. For a plastic such as polymonochlorotrifluoroethylene the method is carried out in detail in the following manner:

Copper tubing 11 is—

(1) Immersed in a mild alkaline bath 16, such as Dy-Clene EW Metal Cleaner, as manufactured by MacDermid, Inc., of Waterbury, Connecticut, for five seconds;

(2) Rinsed in cold, running water for five seconds;

(3) Dipped for 15 seconds in a 10 percent solution of hydrochloric acid (HCl) 17 containing a small amount of ferric chloride ($FeCl_3$);

(4) Rinsed in cold, running water for five seconds;

(5) Immersed in a 10 percent solution 18 of sodium cyanide (NaCN) for 15 seconds and then rinsed;

(6) Immersed for 10 minutes at 190° F.–210° F. in an oxidizing agent 19 such as an aqueous solution of 1½ pounds of Ebonol "C" Special, as manufactured by Enthone, Inc., New Haven, Connecticut, per gallon of water. The oxidizing agent is preferably a hot aqueous solution consisting essentially of an alkali selected from the group consisting of sodium hydroxide and potassium hydroxide and a chlorite selected from the group consisting of sodium chlorite and potassium chlorite;

(7) Immersed in cold, running water;

(8) Rinsed in hot, running water for 10 to 20 seconds; and (9) Baked in a preheated oven 20 at a temperature above 212° F. until all traces of moisture are removed.

These steps result in providing copper tubing having a cupric oxide surface obtained by utilizing a chemical agent rather than by applying heat as in the prior art. The cupric oxide obtained in the manner described in steps 1 to 9 above is quite different from that obtained by heating. It appears as a homogeneous, velvety black coating. The black is intense. Under a microscope of greater than 300 power, the crystals of oxide appear fine and needle-like and in a much thinner layer than that obtained when copper is heated. Further, and probably most important, this cupric oxide differs from that obtained by heating in that it is tightly bonded to the copper and will not flake off.

The copper tubing obtained by means of steps 1 to 9 above is now ready for lamination to a plastic. The lamination process is, for example, as follows:

(10) Place a sheet of thin, metallic-foil mold release plate, such as aluminum, on a platen of a press 22, such as manufactured by Wabash Press Company, Wabash, Indiana; the aluminum foil is used to prevent adherences between the polymonochlorotrifluoroethylene and the platen;

(11) Place a lamination of a sheet of plastic material on the platen 21 of the press 22. This lamination may have as many layers as desired, for reasons to be considered more fully hereinafter. The plastic may be, for example, polymonochlorotrifluoroethylene and each sheet may be, for example, 6 inches long, 2 inches wide and 10 mils thick. The temperature of the oven is, for example, 400° C.;

(12) Place the copper tubing, coated in accordance with steps 1 to 9 above, on top of a polymonochlorotrifluoroethylene layer of the laminate and apply an initial pressure of approximately 5 pounds per square inch, gradually increasing the pressure;

(13) Bake under pressure at 216° C.–219° C. for 40 seconds;

(14) Remove the copper tubing plastic laminate from the press and quench in cold water; and

(15) Remove the aluminum foil.

Though definite pressure and temperatures are mentioned above, the pressures, times, and temperatures are interrelated and vary also with the thickness, area, and type of plastic material used. Generally, the temperature is in the range of 215° C.–300° C., the initial pressure being of the order of 5 pounds per square inch, but building up to higher pressures which may be of the order of hundreds of pounds per square inch. The parameters are time-temperature, primarily; and to some degree, time and temperature in terms of the pressure applied may be interchanged.

The plastic can, of course, have copper tubing applied to both sides merely by placing tubing both above and below the plastic. Similarly, a number of sheets of plastic may be intermixed with cupric oxide coated copper tubing to form a laminated structure.

Another method for effecting the bond, and perhaps a better method of maintaining the tubing spacing, involves the use of a rotary press. The rollers are heated to a temperature of 215° C.–250° C. and thermostatically maintained. The copper tubing-to-plastic bond is effected by applying copper tubing to the surface of a sheet of plastic such as polymonochlorotrifluoroethylene and introducing the composite article between the rollers. The spacing of the tubular conductors may be regulated and maintained by having a comb-like structure riding on the surface of the plastic sheeting as it is being fed between the rollers, the teeth of the comb being spaced in pairs separated by a distance equal to the width of the copper tubing and each pair of teeth in turn being separated by a distance equivalent to the desired spacing of the tubular conductors. Preferably, the rollers are spaced so as to apply a positive pressure greater than 5 pounds per square inch and are rotated at such a rate as to provide a linear speed of, for example, 10 inches per minute to the sheets.

A modified form of the improved method of bonding polymonochlorotrifluoroethylene to copper tubing involves the use of powdered polymonochlorotrifluoroethylene which is poured into a press having the cupric oxide coated copper tubing suspended therein. For unplasticized powder of high molecular weight, the operating temperature range may be as high as 300° C. After placing the powder in contact with the copper tubing the press is closed at a rate of 0.2 inch per minute until the desired thickness is obtained as determined by gauge blocks. By shining a light through the material, a color change will be observed from pink to white. After the white light appears, the press is held in place for 15 to 30 seconds, depending upon the thickness of the material desired. The composite sheet thus obtained is then quenched in cold water or transferred to a cold press. In both processes immediate quenching produces crystallization and, thus, a relatively high degree of transparency. Other layers of plastic can be added as desired.

*Polytetrafluoroethylene-copper article*

Figure 8:
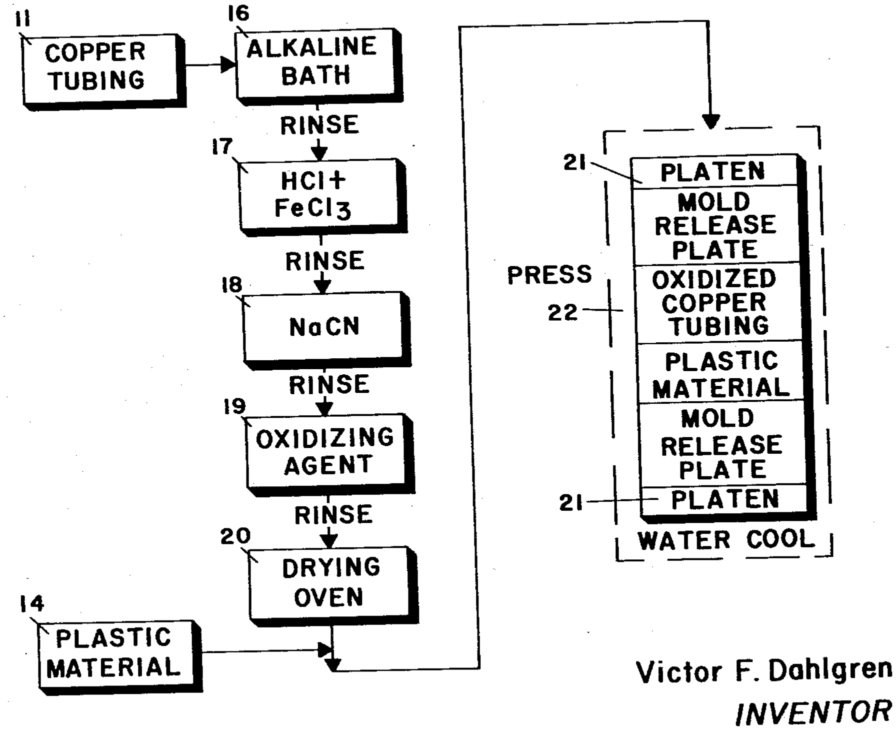
FIG. 8 is a flow chart illustrating a preferred process for manufacturing the article of the present invention.

Using the same apparatus and general procedure as outlined in FIG. 8 and differing only in the plastic to copper bonding process, a thin sheet of Teflon, for example 0.010 inch thick, is placed in contact with cupric oxide coated copper tubing of, for example 3/16 inch outside diameter, and placed in the press 22. The plastic-copper tubing laminate is preheated at approximately 700° F. for several minutes and then pressed at that temperature in the order of 250 pounds per square inch for about 6 minutes. The laminate is then water cooled in the press under continued pressure.

The plastic-copper bonding mechanism is not thoroughly understood; however, as a result of much experimentation and analysis, it is believed that the bonding mechanism is essentially mechanical. One basic requirement seems to be that the plastic material must flow fairly readily without decomposing. Some plastic materials tend to decompose before the desired melt-viscosity is reached even though a satisfactory bond may still be obtained. In the case of some forms of Teflon, the degree of plasticity increases with temperature but the material tends to decompose before it reaches a suitable flow point. It will be apparent, however, that while a degree of flow is necessary to cause the plastic material to fill the interstices formed by the cupric oxide needles, more or less randomly oriented, a good bond is obtainable even though ideal flow conditions are not realized. In the case of some polyvinyl materials it has been frequently observed that the bond is stronger than the plastic material itself.

The present invention represents an important step forward in the art of preformed circuitry, in that the dielectric and flexibility properties of plastic materials may be successfully utilized.

While there have been described what are at present considered to be the preferred embodiments of this invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. A flat, flexible circuit cable, comprising: a flat, flexible sheet of thermoplastic, organic plastic insulating material; and a plurality of tubular, flexible, elongated conductors encapsulated within said plastic insulating material to provide a flexible circuit cable, said tubular conductors having discretely spaced slugs of solder disposed therein to facilitate interconnection with an external conductor at intermediate points along said cable by piercing said insulation and encapsulated conductor in the vicinity of said solder and effecting said interconnection.

2. A flat, flexible sheet of thermoplastic insulating material; a plurality of tubular, flexible, impervious elongated conductors encapsulated within said plastic insulating material, said conductors being flattened at least in part to enhance the flexibility thereof, male connectors having external gripping elements thereon, said conductors having engaging end openings receiving said connectors, said external gripping elements additionally maintaining mechanical and electrical connection with said conductors.

References Cited in the file of this patent

UNITED STATES PATENTS

| | | |
|---|---|---|
| 355,611 | Howson | Jan. 4, 1887 |
| 717,778 | Spaulding | Jan. 6, 1903 |
| 750,563 | Anderson | Jan. 26, 1904 |
| 1,640,869 | Armstrong et al. | Aug. 30, 1927 |
| 2,175,144 | Davison | Oct. 3, 1939 |
| 2,258,750 | Eichwald | Oct. 14, 1941 |
| 2,274,087 | Morten | Feb. 24, 1942 |
| 2,293,911 | Morten et al. | Aug. 25, 1942 |
| 2,389,725 | Gillis et al. | Nov. 27, 1945 |
| 2,611,800 | Naughton | Sept. 23, 1952 |
| 2,729,696 | Mapelsden et al. | Jan. 3, 1956 |
| 2,745,898 | Hurd | May 15, 1956 |

FOREIGN PATENTS

| | | |
|---|---|---|
| 589,938 | Great Britain | July 3, 1947 |

OTHER REFERENCES

Electronics (Publication), page 313, December 1955.